(12) United States Patent
Tseng

(10) Patent No.: US 6,168,997 B1
(45) Date of Patent: Jan. 2, 2001

(54) METHOD OF FORMING POLY GATE AND POLYCIDE GATE WITH EQUAL HEIGHT

(75) Inventor: Horng-Huei Tseng, Hsinchu (TW)

(73) Assignee: Vanguard International Semiconductor Corporation, Hsinchu (TW)

( * ) Notice: Under 35 U.S.C. 154(b), the term of this patent shall be extended for 0 days.

(21) Appl. No.: 09/298,964

(22) Filed: Apr. 26, 1999

(51) Int. Cl.$^7$ ................................................. H01L 21/8234
(52) U.S. Cl. ............................................. 438/275; 438/592
(58) Field of Search ................................. 438/241, 258, 438/275, 592, 655, 657

(56) References Cited

U.S. PATENT DOCUMENTS 5,472,892 * 12/1995 Gwen et al. ........................... 438/592
5,654,219 * 8/1997 Huber .................................... 438/258

* cited by examiner

*Primary Examiner*—Chandra Chaudhari
(74) *Attorney, Agent, or Firm*—Bacon & Thomas

(57) ABSTRACT

The invention is provided for forming poly gate and polycide gate with an equal height in a semiconductor device fabricated on a substrate to reduce the sheet resistance of the poly gate electrode. First, gate oxide layer is formed on a substrate, and then a first polysilicon layer, a silicide layer, and a capped dielectric layer are sequentially deposited. Next, a polycide gate is patterned by using a first photoresist layer, and then the capped dielectric layer and the silicide layer are etched. Next, the first photoresist layer is removed. Thereafter, a second polysilicon layer is deposited. Then, a poly gate is patterned by using a second photoresist layer, and the first polysilicon layer and the second polysilicon layer is etched. Finally, the second photoresist layer is removed.

38 Claims, 4 Drawing Sheets

METHOD OF FORMING POLY GATE AND POLYCIDE GATE WITH EQUAL HEIGHT

BACKGROUND OF THE INVENTION

1. Field of the Invention

The present invention relates to a method of forming MOSET and more particularly to a method of forming a poly gate and a polycide gate with an equal height on one chip.

2. Description of the Prior Art

Integrating the periphery circuits on a chip is a stream of electronic products in the technology development of the electronic industry. Recently, the improvement of semiconductor processing make the integration of memory cells and periphery circuits on one chip possible.

Taking an image device as an example, in order to improve the performance and resolution of images, each image has to be divided into millioned pixels. Then each pixel is memorized in a memory cell by the form of digital data. One aspect to show the characteristics of an image device is the accuracy of electronic signals memorized by memory cells for each pixel array. If the problem of current leaking occurs in the memory cells, the electronic signals of pixels can not be recorded exactly which will produce many dots on the image. Another aspect to show the characteristics of an image device is the accessing speed of the periphery circuits integrated on the chip. The accessing speed has to be fast enough for dealing with a great amount of data. Therefore, for an image device a chip should correspond to two demands concurrently. One of the demands is that current leaking is rigidly limited, but the accessing speed is not important. Another demand is that a high accessing speed is necessary, but the current leaking is not the key consideration.

In a semiconductor device, Metal-Oxide-Semiconductor Field-Effect Transistor (MOSFET) is one of the most important elements for the VLSI integrated circuits. A MOSFET includes a gate structure, a source and a drain, wherein the source and drain are located at the sides of the gate structure. The gate structure includes a metal layer at the top named gate electrode, an oxide layer under the metal layer named gate oxide, and a semiconductor layer at the bottom.

Typically, the metal layer at the top of the gate structure is formed by polysilicon, thereby the gate structure is named poly gate. Because polysilicon does not have a lowest resistance, sometimes a layer of silicide is deposited overlying the polysilicon layer to form a polycide gate for lowering the resistance.

Because poly gate does not have a lowest resistance, its accessing speed is not the fastest. But the problem of current leaking in poly gate is not serious, which makes poly gate be a good element for the pixel array area in a image device. On the other hand, the problem of current leaking in polycide gate is worse than that in poly gate, but polycide gate has a lower resistance which can decrease the TC time delay and increase the device switching speed. Therefore, the polycide gate is better than poly gate to be the element for the periphery circuit area in a image device for providing a high speed to deal with a great amount of pixel data in the periphery circuit area.

In order to form poly gate and polysice gate on one silicon substrate concurrently, several issues about the process and products are derived. Referring now to FIG. 1, a cross-sectional view of the poly gate and polycide gate formed on a substrate according to a prior art of the present invention, a gate oxide layer 2 is formed on a semiconductor substrate 1. Then, a poly gate including a polysilicon layer 3 is formed at the poly gate area by the methods of deposition, photo-lithography and etching. Next, a polycide gate is formed at the polycide gate area, wherein the polycide gate has a polysilicon layer 3 and a silicide layer 4.

Because polysilicon has a higher resistance than polycide, and the height of poly gate is lower than the height of polycide gate, as shown in FIG. 1, the conventional structure in FIG. 1 makes the poly gate have a much higher sheet resistance than the polycide gate. Therefore, the accessing speed of the products produced by the conventional technology is not good enough. For the image device described above, the obvious difference of accessing speed between the cell area and the periphery area can not make the device achieve a best operating state. Therefore, the present invention seeks to provide a method for solving this problem.

SUMMARY OF THE INVENTION

The present invention seeks to provide a method of forming poly gate and polycide gate with an equal height in a semiconductor device fabricated on a substrate to reduce the sheet resistance of the poly gate electrode.

According to the present invention, there is provided a method of forming poly gate and polycide gate with an equal height in a semiconductor device fabricated on a substrate, comprising the steps of forming a gate oxide layer on a starting substrate; sequentially depositing a first polysilicon layer, a silicide layer, and a capped dielectric layer; patterning a polycide gate by using a first photoresist layer, and then etching the capped dielectric layer and the silicide layer; removing the first photoresist layer; depositing a second polysilicon layer; patterning a poly gate by using a second photoresist layer, and then etching the first polysilicon layer and the second polysilicon layer; and finally removing the second photoresist layer.

BRIEF DESCRIPTION OF THE DRAWINGS

Embodiments of the invention will now be described by way of example, with reference to the accompanying drawings, in which.

DETAILED DESCRIPTION OF THE PREFERRED EMBODIMENT

Figure 1:
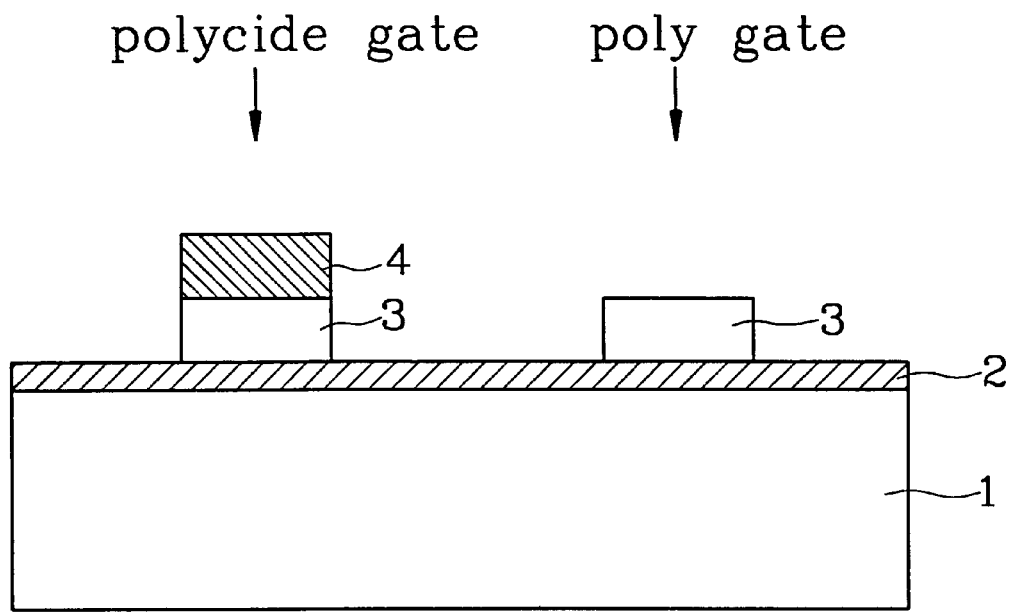
FIG. 1 is a cross-sectional view of the poly gate and polycide gate formed on a substrate according to a prior art of the present invention.
Figure 2:
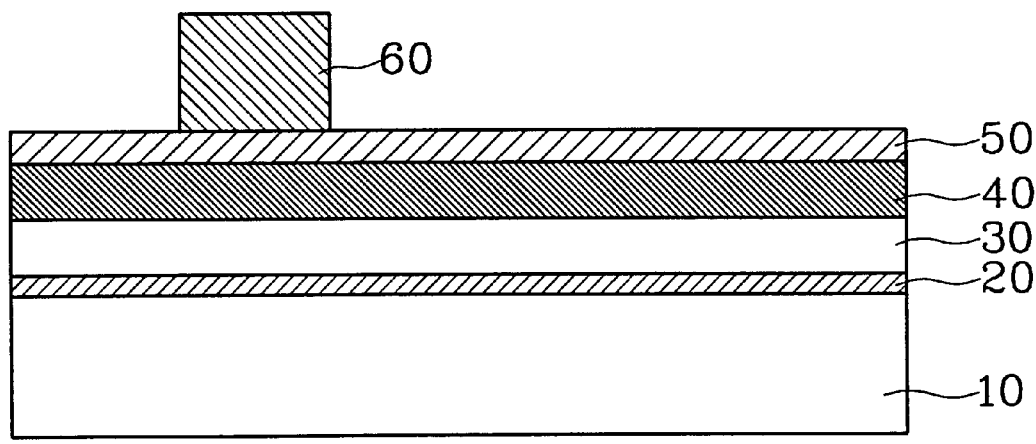
FIG. 2 is a cross-sectional view of part of a partially fabricated integrated circuit structure at successive stages in forming a gate oxide layer, a first polysilicon layer, a silicide layer, a capped dielectric layer, and a first photoresist layer according to a first embodiment and a second embodiment of the present invention.

In a method of forming poly gate and polycide gate in a semiconductor device fabricated on a substrate according to a first embodiment of the present invention, a starting substrate of semiconductor silicon wafer 10 for an integrated circuit is provided, as shown in FIG. 2. The substrate wafer is provided with an gate oxide layer 20 having a thickness between 50~300 Å overlying an active area.

Subsequently, a first polysilicon layer 30 having a thickness between 500~3000 Å is deposited. The first polysilicon layer 30, which is in-situ doped CVD polysilicon, is used to be a portion of a poly gate and the polysilicon layer of a polycide gate. Thereafter, a silicide layer 40 having a thickness between 300~3000 Å is deposited for the polycide gate. Silicide, which has a lower sheet resistance than polysilicon and forms Ohmic Contact between polysilicon and metal, can reduce the RC time delay, and increase the device operation speed. The metal element in silicide is selected from the group of refractory metals, such as Ti, Mo, Ta, Pt, and W. Tungsten Silicide ($WSi_x$) is usually provided for semi-conductor processing because its thermal extension coefficient closes to the thermal extension coefficient of silicon which makes a low stress between silicide and polysilicon.

Next, a capped dielectric layer 50 having a thickness between 500~3500 Å is deposited by chemical vapor deposition (CVD). The capped dielectric layer 50 is CVD silicon oxide or CVD silicon nitride. The capped dielectric layer 50 is used to be a mask for protecting the silicide layer from etching in the following polysilicon etching step. Then, a first photoresist layer 60 is formed with a polycide gate pattern as a mask for defining a polycide gate, as shown in FIG. 2.

Figure 3:
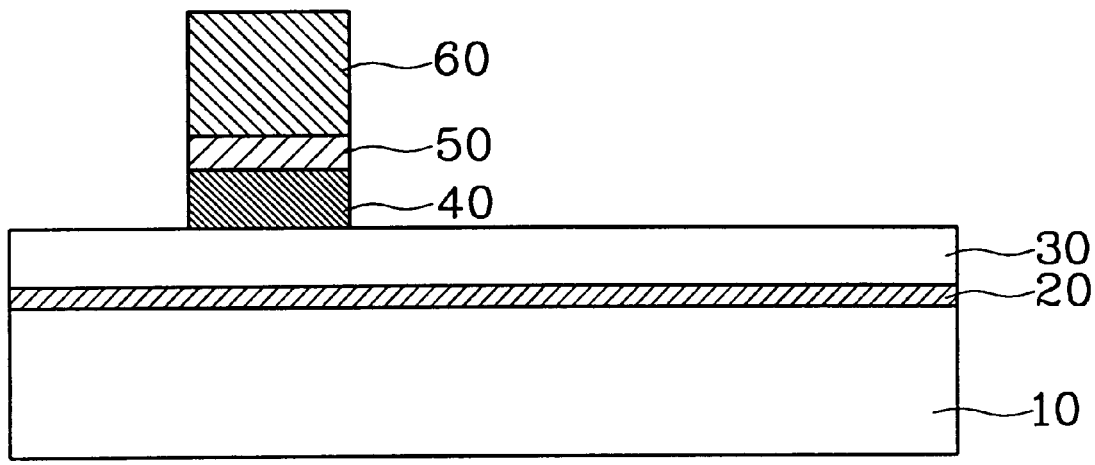
FIG. 3 is a cross-sectional view of part of a partially fabricated integrated circuit structure at successive stages in etching the capped dielectric layer and the silicide layer according to a first embodiment and a second embodiment of the present invention.
Figure 4:
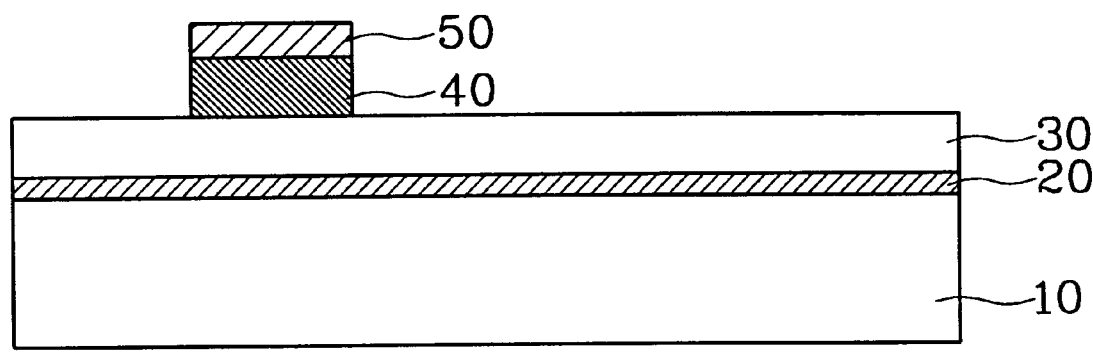
FIG. 4 is a cross-sectional view of the part of a partially fabricated integrated circuit structure at successive stages in removing the first photoresist layer according to a first embodiment and a second embodiment of the present invention.

Referring now to FIG. 3, the capped dielectric layer 50 and silicide layer 40 are etched sequentially. This etching step is stopped at the first polysilicon layer 30 by the end-point mode. Then, the photoresist layer 60 is removed, as shown in FIG. 4.

Figure 5:
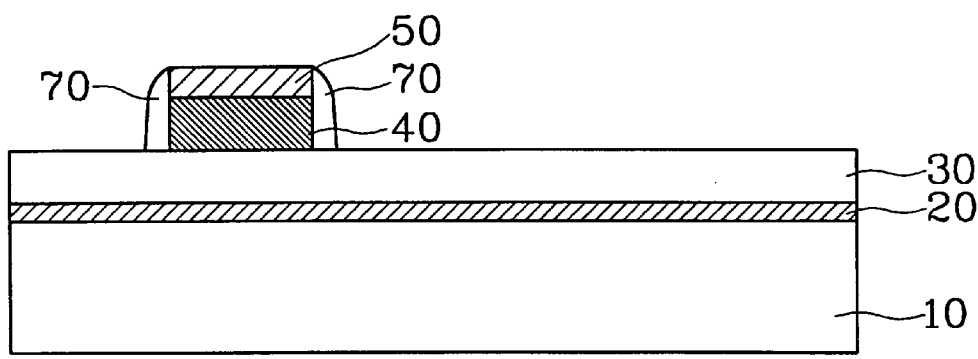
FIG. 5 is a cross-sectional view of the part of a partially fabricated integrated circuit structure at successive stages in forming spacers on the silicide layer according to a first embodiment of the present invention.

Next, spacers 70 are formed on the sidewall of the silicide layer, as shown in FIG. 5. The silicide sidewall spacers 70 are formed by depositing a layer of dielectric material and then etching the dielectric material layer anisotropically, wherein the dielectric material can be CVD silicon oxide or CVD silicon nitride.

Figure 6:
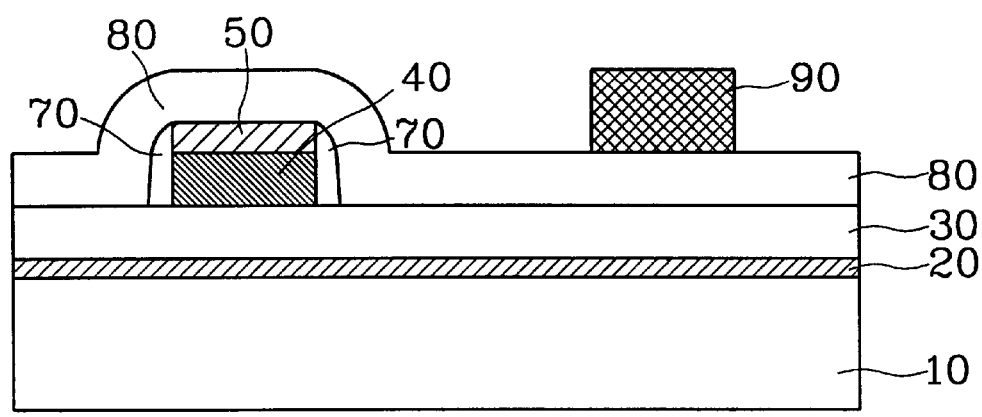
FIG. 6 is a cross-sectional view of the part of a partially fabricated integrated circuit structure at successive stages in depositing a second polysilicon layer and forming a second photoresist layer according to a first embodiment of the present invention.

Referring now to FIG. 6, a second polysilicon layer 80 is deposited with a thickness between 300~3000 Å, wherein the thickness is almost equal to the thickness of the silicide layer 40. The second polysilicon layer 80, which is in-situ doped CVD polysilicon, is used to be a portion of the poly gate. Then, a second photoresist layer 90 is formed with a poly gate pattern as a mask for defining a poly gate.

Figure 7:
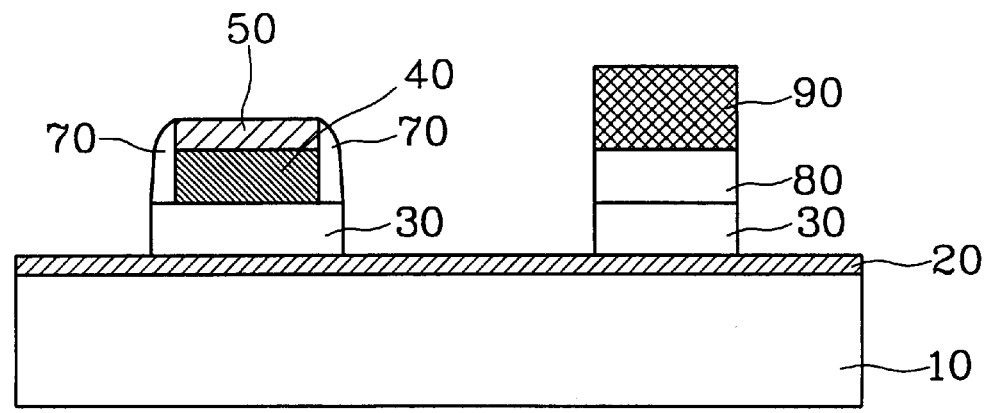
FIG. 7 is a cross-sectional view of the part of a partially fabricated integrated circuit structure at successive stages in etching the first polysilicon layer and the second polysilicon layer according to a first embodiment of the present invention.
Figure 8:
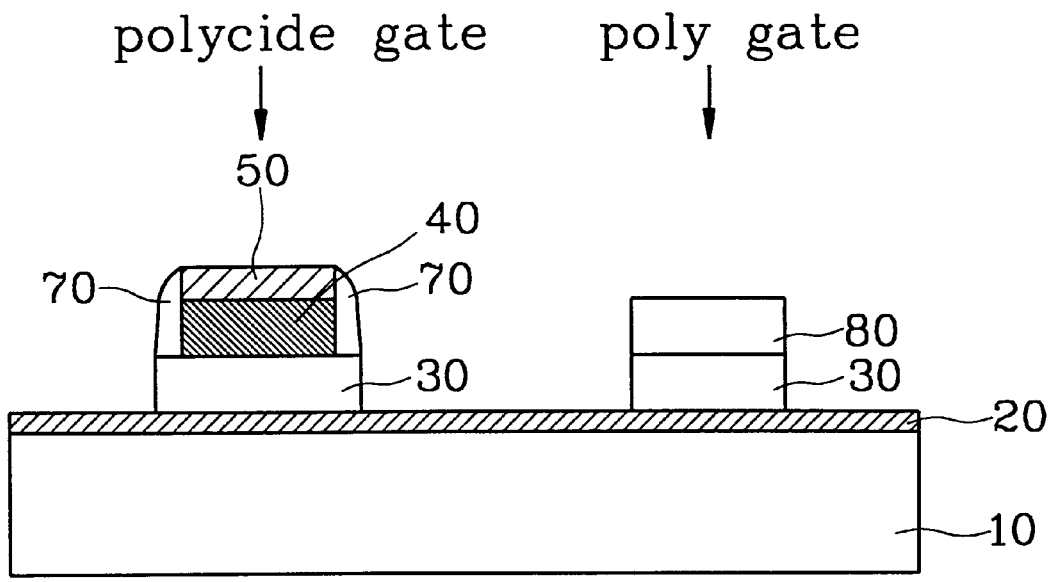
FIG. 8 is a cross-sectional view of the part of a partially fabricated integrated circuit structure at successive stages in removing the second photoresist layer according to a first embodiment of the present invention.

Subsequently, the second polysilicon layer 80 and the first polysilicon layer 30 are etched sequentially, as shown in FIG. 7. During this etching step, the poly gate is protected by photoresist layer 90, and the polycide gate is protected by the capped dielectric layer 50 and spacers 70. Finally, the second photoresist layer 90 is removed to finish the fabrication of poly gate and polycide gate with an almost equal height, as shown in FIG. 8.

In a method of forming poly gate and polycide gate in a semiconductor device fabricated on a substrate according to a second embodiment of the present invention, a starting substrate of semiconductor silicon wafer 10 for an integrated circuit is provided, as shown in FIG. 2. The substrate wafer is provided with an gate oxide layer 20 having a thickness between 50~300 Å overlying an active area.

Subsequently a first polysilicon layer 30 having a thickness between 500~3000 Å is deposited. The first polysilicon layer 30, which is in-situ doped CVD polysilicon, is used to be a portion of a poly gate and the polysilicon layer of a polycide gate. Thereafter, a silicide layer 40 having a thickness between 300~3000 Å is deposited for the polycide gate. The metal element in silicide is selected from the group of refractory metals, such as Ti, Mo, Ta, Pt, and W. Tungsten Silicide ($WSi_x$) is usually provided for semi-conductor processing.

Next, a capped dielectric layer 50 having a thickness between 500~3500 Å is deposited by chemical vapor deposition (CVD). The capped dielectric layer 50 is CVD silicon oxide or CVD silicon nitride. The capped dielectric layer 50 is used to be a mask for protecting the silicide layer from etching in the following polysilicon etching step. Then, a first photoresist layer 60 is formed with a polycide gate pattern as a mask for defining a polycide gate, as shown in FIG. 2.

Referring now to FIG. 3, the capped dielectric layer 50 and silicide layer 40 are etched sequentially. This etching step is stopped at the first polysilicon layer 30 by the end-point mode. Then, the photoresist layer 60 is removed, as shown in FIG. 4.

Next, a second polysilicon layer 80 is deposited with a thickness between 300~3000 Å, wherein the thickness is almost equal to the thickness of the silicide layer 40, as shown in FIG. 6 without the spacers 70. The second polysilicon layer 80, which is in-situ doped CVD polysilicon, is used to be a portion of the poly gate. Then, a second photoresist layer 90 is formed with a poly gate pattern as a mask for defining a poly gate.

Figure 9:
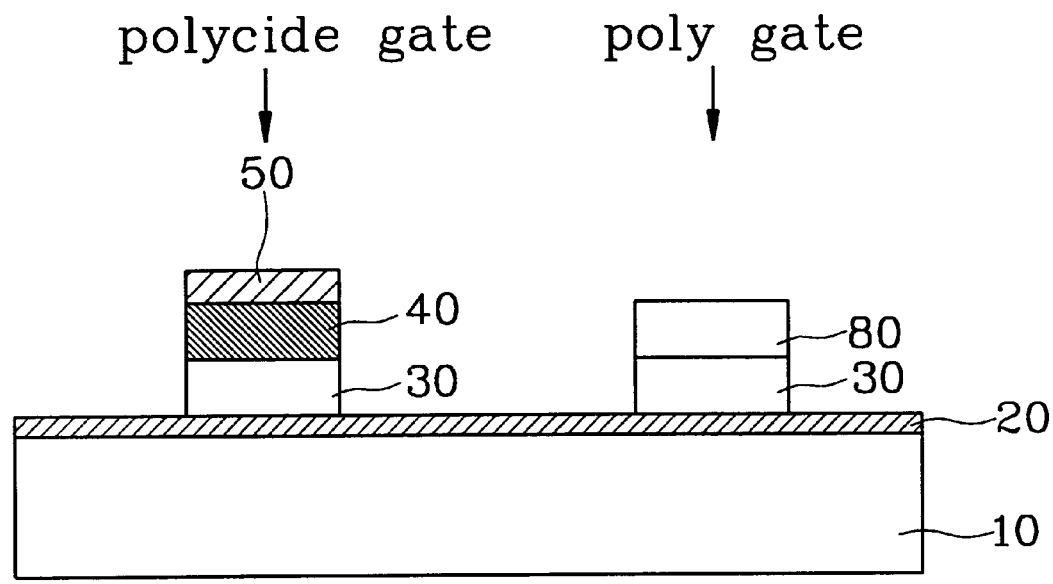
FIG. 9 is a cross-sectional view of a poly gate and a polycide gate with an equal height formed on a substrate according to a second embodiment of the present invention.

Subsequently, the second polysilicon layer 80 and the first polysilicon layer 30 are etched sequentially, as shown in FIG. 7 without the spacers 70. During this etching step, the poly gate is protected by photoresist layer 90, and the polycide gate is protected by the capped dielectric layer 50. Finally, referring now to FIG. 9, the second photoresist layer 90 is removed to finish the fabrication of poly gate and polycide gate with an almost equal height.

From the above description, the height of the poly gate is almost equal to the height of the polysice gate in the present invention. Therefore, the poly gate has a lower sheet resistance than it in the prior art. Thereby the difference of sheet resistance between poly gate and polycide gate is reduced, which can lower the difference of accessing speed between the cell area and the periphery area in an image device to achieve a better operating state.

Alternatively, the polycide gate in the above embodiments can be replaced by a poly-metal gate having a double-layer structure of a polysilicon layer and a metal layer which is overlaying the polysilicon layer. The poly-metal gate can provide a lower sheet resistance than a poly gate, wherein the metal layer is selected from the group of refractory metals, such as Ti, Mo, Ta, Pt, and W.

It is to be understood that although the present invention has been described with reference to particular preferred embodiments, it should be appreciated that numerous modifications, variations and adaptations may be made without departing from the scope of the invention as defined in the claims.

What is claimed is:

1. A method of forming poly gate and polycide gate in a semiconductor device fabricated on a starting substrate, said method comprising:

(a) forming a gate oxide layer on said starting substrate;

(b) sequentially depositing a first polysilicon layer, a silicide layer, and a capped dielectric layer;

(c) patterning a polycide gate by using a first photoresist layer, and etching said capped dielectric layer and said silicide layer;

(d) removing said first photoresist layer;

(e) forming spacers on the sidewall of said silicide layer;

(f) depositing a second polysilicon layer;

(g) patterning a poly gate by using a second photoresist layer, and etching said first polysilicon layer and said second polysilicon layer; and (h) removing said second photoresist layer.

2. The method as recited in claim 1, wherein said gate oxide layer has a thickness between 50~300 Å.

3. The method as recited in claim 1, wherein said first polysilicon layer has a thickness between 500~3000 Å.

4. The method as recited in claim 1, wherein said silicide layer has a thickness between 300~3000 Å.

5. The method as recited in claim 1, wherein said second polysilicon layer has a thickness between 300~3000 Å.

6. The method as recited in claim 1, wherein said capped dielectric layer has a thickness between 500~3500 Å.

7. The method as recited in claim 1, wherein said first polysilicon layer is doped polysilicon.

8. The method as recited in claim 1, wherein said second polysilicon layer is doped polysilicon.

9. The method as recited in claim 1, wherein said silicide layer is $WSi_x$.

10. The method as recited in claim 1, wherein said silicide layer has a metal element selected from Ti, Mo, Ta, Pt, and W.

11. The method as recited in claim 1, wherein said capped dielectric layer is silicon oxide.

12. The method as recited in claim 1, wherein said capped dielectric layer is silicon nitride.

13. The method as recited in claim 1, wherein said spacers are silicon oxide.

14. The method as recited in claim 1, wherein said spacers are silicon nitride.

15. A method of forming poly gate and polycide gate in a semiconductor device fabricated on a starting substrate, said method comprising:

(a) forming a gate oxide layer on said starting substrate;

(b) sequentially depositing a first polysilicon layer, a silicide layer, and a capped dielectric layer;

(c) patterning a polycide gate by using a first photoresist layer, and etching said capped dielectric layer and said silicide layer;

(d) removing said first photoresist layer;

(e) depositing a second polysilicon layer;

(f) patterning a poly gate by using a second photoresist layer, and etching said first polysilicon layer and said second polysilicon layer; and (g) removing said second photoresist layer.

16. The method as recited in claim 15, wherein said gate oxide layer has a thickness between 50~300 Å.

17. The method as recited in claim 15, wherein said first polysilicon layer has a thickness between 500~3000 Å.

18. The method as recited in claim 15, wherein said silicide layer has a thickness between 300~3000 Å.

19. The method as recited in claim 15, wherein said second polysilicon layer has a thickness between 300~3000 Å.

20. The method as recited in claim 15, wherein said capped dielectric layer has a thickness between 500~3500 Å.

21. The method as recited in claim 15, wherein said first polysilicon layer is doped polysilicon.

22. The method as recited in claim 15, wherein said second polysilicon layer is doped polysilicon.

23. The method as recited in claim 15, wherein said silicide layer is $WSi_x$.

24. The method as recited in claim 15, wherein said silicide layer has a metal element selected from Ti, Mo, Ta, Pt, and W.

25. The method as recited in claim 15, wherein said capped dielectric layer is silicon oxide.

26. The method as recited in claim 15, wherein said capped dielectric layer is silicon nitride.

27. A method of forming poly gate and poly-metal gate in a semiconductor device fabricated on a starting substrate, said method comprising:

(a) forming a gate oxide layer on said starting substrate;

(b) sequentially depositing a first polysilicon layer, a metal layer, and a capped dielectric layer;

(c) patterning a poly-metal gate by using a first photoresist layer, and etching said capped dielectric layer and said metal layer;

(d) removing said first photoresist layer;

(e) depositing a second polysilicon layer;

(f) patterning a poly gate by using a second photoresist layer, and etching said first polysilicon layer and said second polysilicon layer; and (g) removing said second photoresist layer.

28. The method as recited in claim 27, wherein said step (d) can be followed an additive step of forming spacers on the sidewall of said metal layer.

29. The method as recited in claim 27, wherein said gate oxide layer has a thickness between 50~300 Å.

30. The method as recited in claim 27, wherein said first polysilicon layer has a thickness between 500~3000 Å.

31. The method as recited in claim 27, wherein said silicide layer has a thickness between 300~3000 Å.

32. The method as recited in claim 27, wherein said second polysilicon layer has a thickness between 300~3000 Å.

33. The method as recited in claim 27, wherein said capped dielectric layer has a thickness between 500~3500 Å.

34. The method as recited in claim 27, wherein said first polysilicon layer is doped polysilicon.

35. The method as recited in claim 27, wherein said second polysilicon layer is doped polysilicon.

36. The method as recited in claim 27, wherein said metal layer is selected from Ti, Mo, Ta, Pt, and W.

37. The method as recited in claim 27, wherein said capped dielectric layer is silicon oxide.

38. The method as recited in claim 27, wherein said capped dielectric layer is silicon nitride.

* * * * *